United States Patent [19]
Hirt

[11] Patent Number: 6,031,551
[45] Date of Patent: Feb. 29, 2000

[54] PROCESS FOR IMAGING A FERROELECTRIC PRINTING FORM AND PRINTING HEAD

[75] Inventor: Alfred Hirt, München, Germany

[73] Assignee: MAN Roland Druckmaschinen AG, Offenbach am Main, Germany

[21] Appl. No.: 08/785,990

[22] Filed: Jan. 21, 1997

[30] Foreign Application Priority Data

Jan. 18, 1996 [DE] Germany .......................... 196 01 586

[51] Int. Cl.[7] .................................................. B41J 2/415
[52] U.S. Cl. ............................................................ 347/123
[58] Field of Search .................................... 347/112, 119, 347/122, 123, 227, 29, 44; 313/513, 514; 315/111.01, 111.71, 169.1; 399/51, 91; 400/689, 690

[56] References Cited

U.S. PATENT DOCUMENTS 5,117,244  5/1992  Yu .............................................. 347/29
5,765,073  6/1998  Schoenbach et al. .................. 347/112

FOREIGN PATENT DOCUMENTS 38 35 091   4/1990   Germany .

*Primary Examiner*—N. Le
*Assistant Examiner*—L. Anderson
*Attorney, Agent, or Firm*—Cohen, Pontani, Lieberman & Pavane

[57] ABSTRACT

A printing head suitable for imaging a ferroelectric printing form is sealed relative to the printing form by a spring-elastic seal. In the discharge chamber of the printing head, at a low pressure, preferably less than 10 hPa, and especially in the presence of a gas with high ionization probability, a discharge plasma is created, from which charge carriers emerge onto the printing form as the result of activation between electrodes, with simultaneous focussing by the application of electric and/or magnetic fields between plates.

18 Claims, 3 Drawing Sheets

PROCESS FOR IMAGING A FERROELECTRIC PRINTING FORM AND PRINTING HEAD

BACKGROUND OF THE INVENTION

1. Field of the Invention

The invention relates to a process for imaging a ferroelectric printing form as well as to a printing head with which the ferroelectric printing form can be imaged.

2. Description of the Prior Art

Under normal conditions, a printing form made of a ferroelectric material or containing a ferroelectric material can be brought into a stable polarized state in keeping with an image to be subsequently printed by the printing form. This is done by exceeding in the material a critical field strength $E_c$, known as the coercive field strength. During this polarization process, large regions with uniform electric dipolar moment, the domains, are oriented in the field direction and, due to the orientation of the material, form a counterfield that in large part compensates for the externally applied field in the interior of the material.

The ferroelectric material is polarized, for example, by attaching electrodes to both sides of the printing form and applying an electric voltage between them. In the case of removable electrodes that establish touch contact with the surface of the material, there must always be an air gap or non-conducting dielectric layers between the electrodes and the printing form. It is therefore inevitable that, due to varying permittivity, a large part of the electric voltage drops off in these layers and only a small electric field is built up in the ferroelectric printing form. Nonetheless, the field strengths in the blocking layers are sufficient to produce micro discharges through these layers, by means of which the ferroelectric layer is polarized in accordance with the image.

Another method of polarizing a ferroelectric printing form is to charge the surface with charge carriers. For this purpose, the surface is subjected to ion or electron beams from charge carrier sources. Charging the surface of the ferroelectric material with free charges causes an electric field to build up in the interior of the material. If this electric field exceeds the coercive field strength of the ferroelectric material, then the domains flip around in a spontaneous process (spontaneous polarization) and form a counterfield in the interior of the material to the electric field on the surface of the material. As a result, very thin regions known as double layers are created on both surfaces of the ferroelectric material; in these regions, the total potential resulting from the charge declines and the previously free charges are bound to the surface in stationary manner by the electrostatic forces thereby created. In the polarized state, the ferroelectric material therefore has charges on its surfaces that are bound to the surface in stationary fashion by the extremely high field strength which the dipolar orientation produces in the interior of the ferroelectric material. These charges screen off the internal field, so that an almost field-free space is created toward the outside at some distance. The polarized state remains stable as long as no reversal of the internal field occurs. Polarization in the opposite direction is possible if the existing charges are first neutralized with charge carriers of the opposite polarity and then, as the result of further charging, an opposite field in the interior leads to spontaneous flipping of the domains.

A non-contact printing head to polarize the printing form in keeping with the image consists of charging sources that can be controlled in keeping with the image. Non-contact printing heads of this type are known and used in electrographic printing processes. In these processes, free charges are transferred to non-conducting dielectric printing forms in keeping with the image. The image can subsequently be developed with electrically charged ink particles (toner particles). During printing processes with such dielectric printing forms, the charge is largely given off to the printing stock together with the ink particles. The known dielectric printing form does allow copies to be produced; however, it is only possible to do so as long as charges still remain on the surface of the printing form. Once all charges have been depleted during the printing process—for example, after about 10 to 20 copies have been printed—the printing process is over. The printing form must be imaged again. Another disadvantage of the known dielectric printing form is that the charge image remains stable for only a limited time and can be destroyed by contact with conductive materials or moist air. Because of this disadvantage, the printing head for imaging must also work in a non-contact fashion.

An ionographic printing head is known from the Technical Research Publication S 6000 OEM of Delphax Systems. This printing head works in a non-contact fashion during normal printing, because the production of a vacuum by sealing the gap between the printing form and the printing head, as described above, is not possible and cannot be carried out by differential pumping at acceptable expense. It is not possible to use a printing head seal that rests on the printing form, because a charge pattern applied by the printing head would be rubbed off in known dielectric printing forms. The known printing head images the printing form by means of briefly ignited high-frequency discharges. Like the Corona discharge also used by known printing heads, this form of discharge provides a rather low charge yield of less than $10^{-6}$ C/cm$^2$. This results in a lengthy imaging time. In normal printing, another disadvantage of the discharge is the short free path of the produced charge carriers. On the short path between their sources and the surface of the printing form, the charge carriers, because of collisions with surrounding gaseous atoms, are controllable by electric or magnetic fields only to a slight extent. Electrostatic or magnetic focussing is thus only conditionally possible. Ionographic printing heads are therefore not suitable for the production of high-quality prints.

From German reference DE 38 35 091 A1, a ferroelectric printing form is known that is imaged by means of a known printing head. The printing head is connected to a conventional control unit and produces a charge image on the printing form in keeping with an image to be printed.

SUMMARY OF THE INVENTION

It is an object of the present invention is to provide a process for imaging a ferroelectric printing form that works faster than the conventional processes and results in a higher resolution of the charge carrier image produced by the printing head on the printing form.

Pursuant to this object, and others which will become apparent hereafter, one aspect of the present invention resides in a process for imaging a ferroelectric printing form. The process includes the steps of producing a discharge plasma in a vacuum in a discharge chamber of a printing head, deflecting electric charge carriers from the plasma by electric attraction in a direction of the printing form to polarize the printing form in accordance with image points, and maintaining the vacuum in the discharge chamber with a seal between the printing head and the printing form.

In another embodiment of the invention the beams of the charge carriers deflected toward the printing form are focused by plates which have holes, openings or recesses. The plates are arranged between the discharge chamber and a surface of the printing form. A focusing is carried out by applying an electric and/or magnetic field between the plates.

In still another embodiment of the invention a gas with high ionization probability, particularly a noble gas, is introduced into the discharge chamber of the printing head by a pumping device and the air in the discharge chamber is drawn out by a pumping device.

In yet a further embodiment of the inventive process the discharge plasma in the discharge chamber is produced by one of direct current, alternating current or a high frequency electric field.

A further object of the invention is to provide a printing head for use in the inventive process.

Pursuant to this object, another aspect of the present invention resides in a printing head for imaging a ferroelectric printing form. The inventive printing head includes a discharge chamber and an elastically deformable seal connected to the discharge chamber and configured to be sealingly contactable against a surface of the printing form.

In yet another embodiment of the inventive printing head at least one electrode is provided that is operative to produce at least one discharge plasma. If more than one electrode is provided, a corresponding number of discharge plasmas are produced.

Still another embodiment of the inventive printing head includes plates formed at least partially as elongate separated adjacent wafers having holes therein. The wafers are individually controllable chronologically according to the image points to be produced on the printing form.

In yet another embodiment of the invention the seal is formed of a rubber, an elastic plastic material, or of spring-supported sealing elements.

In contrast to other dielectric materials, ferroelectric materials have the property that a charge pattern applied to them is not destroyed by contact. A conventional movable elastic seal can therefore be used to produce a vacuum between the printing form and the printing head. Because it then becomes possible to produce a vacuum with air pressure between $10^{-1}$ and 10 hPa, the printing head can be operated in the region of the independent or dependent glow discharge. As a result, it is possible to produce current densities that lie 2 to 3 orders of magnitude above those of the Corona or high-frequency discharge. Because the free path length of the charged particles is in the range between 50 and 200 $\mu$m at the operating pressure of the glow discharge, the beam of charges can be formed by electric and magnetic fields.

According to the invention, an ionographic printing head is used that is sealed relative to the surface of the ferroelectric printing form by a spring-elastic gliding seal. A sufficient vacuum, i.e., a pressure of less than 10 hPa, is produced by a pump connected to the printing head. The electric voltage, which drops off between the electrode or electrodes of the printing head and a counterelectrode located below the ferroelectric printing form, is adapted to the conditions of the glow discharge, which use the electrodes controlled according to the image or the electrodes of the printing head controlled according to the image for beam formation.

It is advantageous for the glow discharge to be driven by the continuous supply of a gas having a higher ionization probability than air, i.e., a noble gas such as krypton, argon, neon or helium, for example. In this way, the charge carrier yield is increased.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PREFERRED EMBODIMENTS

Figure 1:
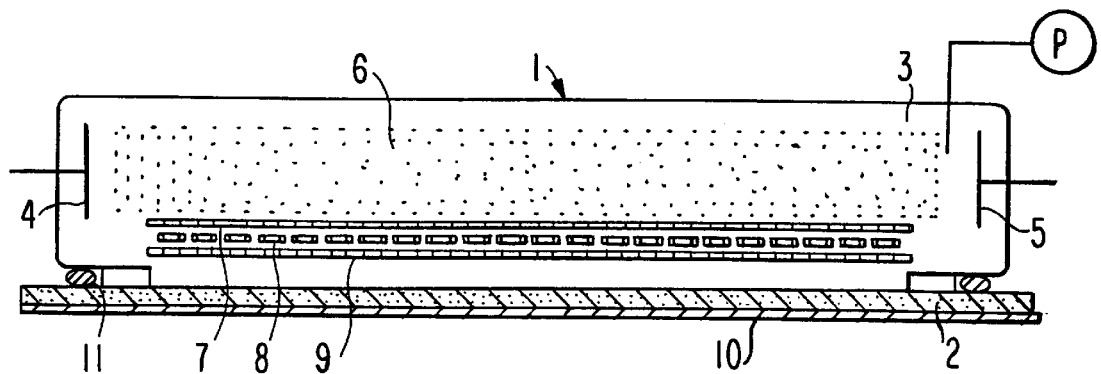
FIG. 1 shows a discharge chamber of a printing head resting on a ferroelectric printing form, pursuant to the present invention.

As seen in FIG. 1, a printing head 1 rests on a printing form 2, which consists of or contains a ferroelectric material. A ferroelectric material is, for example, lead-lanthanum-zirconate-titanate (PLZT). The printing head 1 has a discharge chamber 3. By means of a pump P, the discharge chamber 3 is evacuated until a pressure of less than 10 hPa, particularly between $10^{-1}$ and 10 hPa, exists in it. Preferably, the discharge chamber 3 has a gas supply device (not shown here), which supplies to the discharge chamber 3 a gas having a higher ionization probability, particularly a noble gas, preferably helium or argon, so that the gas responsible for the pressure remaining in the discharge chamber 3 is mainly provided by the gas supplied through the gas supply device. The discharge chamber 3 is preferably equipped with two electrodes 4, 5, between which an electric voltage (direct or alternating current) is applied. In the case of direct electric current, when a permanently burning glow discharge is ignited in the discharge chamber 3, various discharge zones form, with a cathode dark space, an area with negative glow light, a Faraday dark space, a positive column and an anodic drop space. In the case of alternating current, two dark spaces located symmetrically between the electrodes 4, 5, with a charge plasma (item 6 in FIG. 1) located between them, are created. In the positive column of the discharge plasma formed in the case of direct current, or in the discharge plasma created in the case of alternating current, negative and positive charge carriers are roughly equally distributed. Either the positive or the negative charge carriers are drawn off through plates 7, 8, 9 having holes or recesses and accelerated in the direction of the printing form 2 beneath the plates 7–9. Thus, in at least one of the plates 7, 8, 9, depending on the electric field responsible for the acceleration, positive or negative charge carriers reach the printing form 2 and polarize the printing form 2 positively or negatively in keeping with a latent image to be produced there. Depending on the type of charge carriers, the electrode 10 is either at mass potential or at a negative or positive potential. The fields created through the holes or recesses of the plates 7–9 result in a lens effect for the charge carriers. By suitable selection of the potentials on the plates 7–9, it is possible to form a beam. Instead of electrostatic lenses, magnetic fields can also be used for the purpose of beam formation. A combination of electrostatic and magnetic fields is also possible. The printing head 1 is sealed relative to the printing from 2 by a spring-elastic seal 11, which permits the discharge chamber 3 to be evacuated to a slight residual pressure. The seal 11 consists of, for example, a rubber or an elastic plastic or of spring-supported sealing elements.

Figure 2:
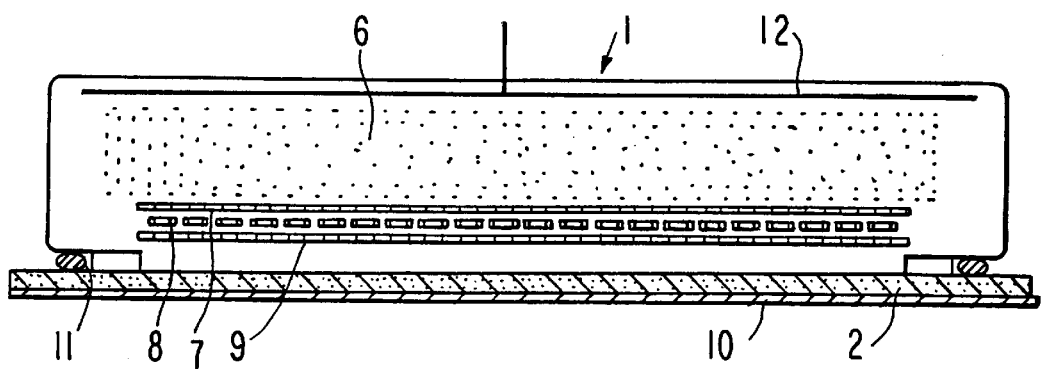
FIG. 2 is a view similar to FIG. 2, of another embodiment of the invention.

Another embodiment of the printing head 1 is shown in FIG. 2. The electrode 12 runs substantially parallel to the surface of the printing form 2. Either the electrode 10 below the printing form 2 or one of the plates 7–9 serves as the counterelectrode. In the latter case, the electrode 10 does not need to be available. In this case, the plate 7, 8 or 9 selected as the counterelectrode is preferably connected as the cathode. Due to inertia, only positive ions pass through the holes of the plate 7, 8 or 9 onto the printing form 2 in the form of so-called channel beams. The other two plates, which are not connected as cathodes, again serve for beam formation; the forces of electric and/or magnetic fields are active. Instead of direct current, alternating current can be used in the embodiment shown in FIG. 2.

The glow discharge in the discharge chamber 3 (FIG. 1, 2) can also be excited by high-frequency electric fields. In this case, the electric field is generated by a Hertz oscillator, so that the electrodes 4, 5 (FIG. 1) or the electrode 4 and the plate 7, 8 or 9 forming the counterelectrode or the electrode 10 are not needed.

Figure 3:
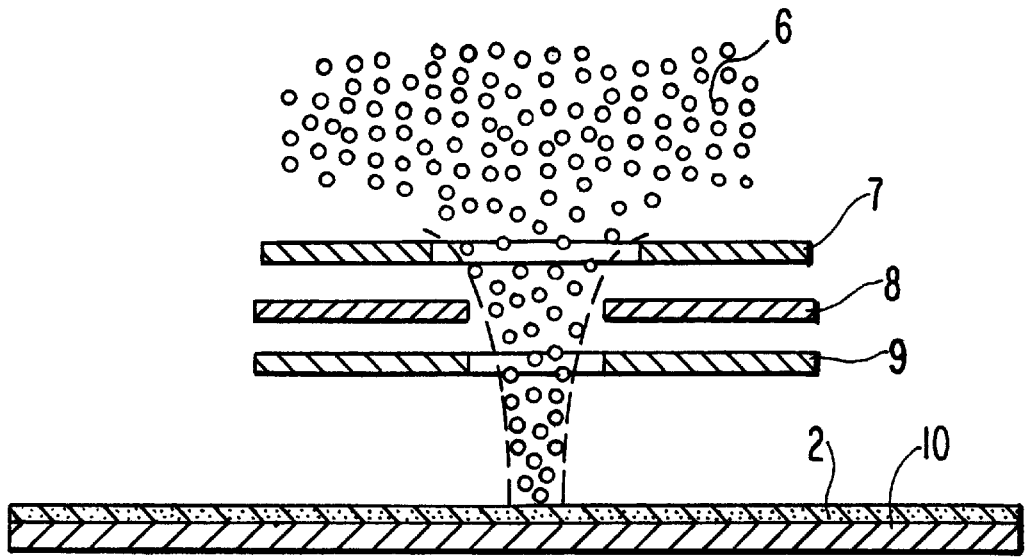
FIG. 3 shows an enlarged section of another discharge chamber of a printing head resting on a ferroelectric printing form.

In the embodiments of the printing head 1 shown in FIGS. 1 and 2, in the entire discharge chamber 3 a single discharge plasma is created, of which an enlarged portion is shown in FIG. 3. Streams of charge carriers are focused through holes or recesses in the plates 7, 8 and 9 and conducted to the surface of the printing form 2.

Figure 4:
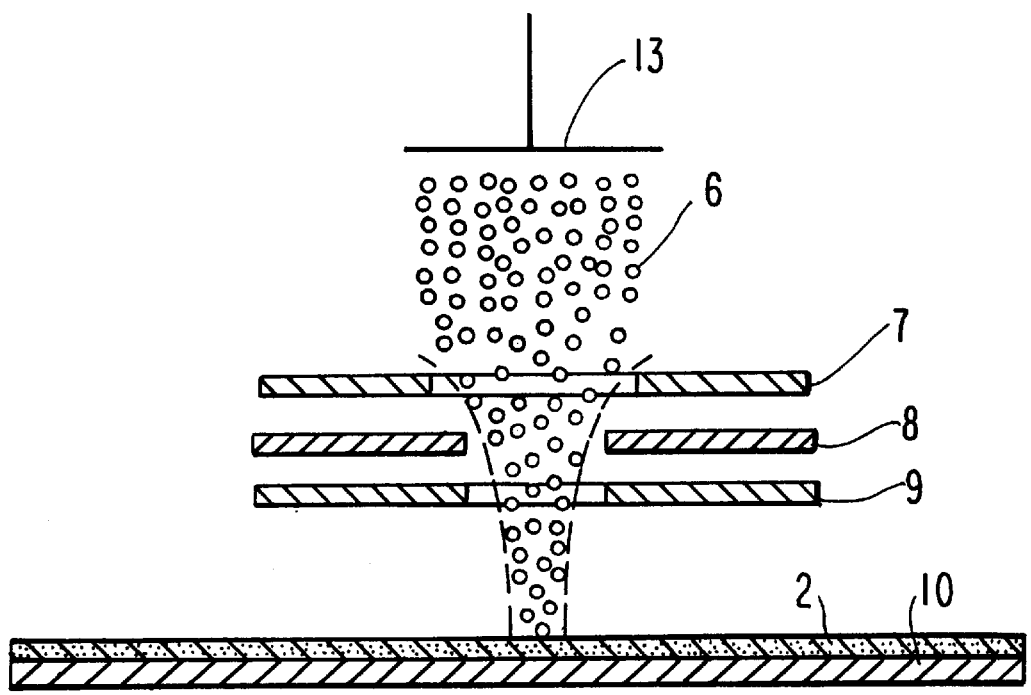
FIG. 4 is a view similar to FIG. 3 of a further embodiment.

Instead of the electrodes 4, 5, 12 for the total discharge chamber 3, there can also be individual electrodes 13 (FIG. 4) associated with the respective openings, located one atop the other, of the plates 7, 8 and 9. The single counterelectrode is formed by the electrode 10 below the printing form 2. Electric and/or magnetic fields again lie between the plates 7, 8 and 9. In this embodiment these can be kept constant, while the electrodes 13, according to the image points to be produced on the printing form 2, are at different electric potentials. The electrodes 13 are, for example, at an electric potential of –3 kV, while the electrode 10 is either at mass potential or at a positive potential of 500 V. The plates 7, 8 and 9 have, for example, potentials of –300 V, –350 V or –100 V. Preferably, if charge carriers are to flow to the printing form 2, the potential difference between the upper plate 7 and the electrodes 13 lies between 2 and 3 kV. In this case, the ignition of the discharge plasma 6 is also carried out by direct or alternating current or in an electrode-free manner with high-frequency fields, so that the electrodes 13 are omitted.

Figure 5:
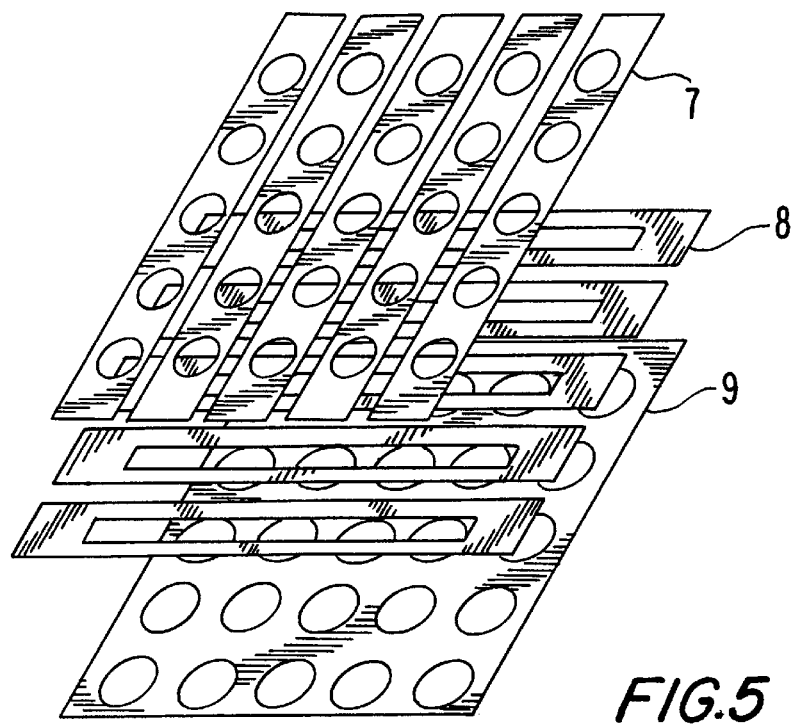
FIG. 5 is an exploded view of plates with holes or recesses for forming the charge carrier beam.
Figure 6:
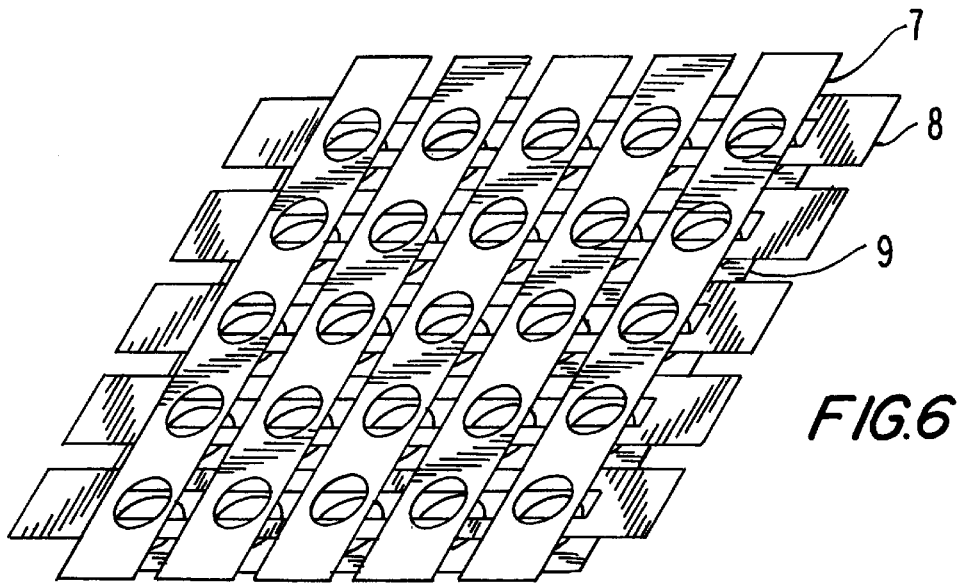
FIG. 6 is an assembled view of the plates in FIG. 5.

FIGS. 5 and 6 shows different forms of the plates 7, 8, 9, which either have holes (plates 7 and 9) or longish recesses and empty spaces (plate 8). The plates 7–9 can also have finger-shaped openings and recesses. The plates 7 and 8 consist of longish flat rods that can be individually electrically or magnetically controlled. By chronological and/or spatial offset of the magnetic and/or electric activation of the plates 7, 8, 9, the surface of the ferroelectric printing form 2 below the printing head 1 can be imaged, so that the printing head 1, after imaging has been carried out, can glide further on the surface of the printing form 2, thanks to the spring-elastic seal 11, which seals the side walls of the printing head 1 relative to the printing form 2 and ensures that no air penetrates into the discharge chamber 3 of the printing head.

The invention provides a printing head 1 that is suitable for imaging a ferroelectric printing form 2. The printing head 1 is sealed relative to the printing form 2 by a spring-elastic seal 11. In the discharge chamber 3 of the printing head 1, at low pressure, preferably less than 10 hPa, and especially in the presence of a gas with high ionization probability, a discharge plasma is created, from which charge carriers emerge onto the printing form as the result of activation between electrodes 12 and 10 with simultaneous focussing by the application of electric and/or magnetic fields between plates 7, 8 and 9.

The invention is not limited by the embodiments described above which are presented as examples only but can be modified in various ways within the scope of protection defined by the appended patent claims.

I claim:

1. A process for imaging a ferroelectric printing form, comprising the steps of: producing a discharge plasma in a vacuum, in a discharge chamber of a printing head; deflecting electric charge carriers from the plasma by electric attraction in a direction of the printing form to polarize the printing form in accordance with image points; and maintaining the vacuum in the discharge chamber with a seal between the printing head and the printing form.

2. A process as defined in claim 1, and further comprising the step of focusing beams of the charge carriers deflected in the deflecting step toward the printing form with plates having at least one of holes, openings and recesses and arranged between the discharge chamber and a surface of the printing form, by applying at least one of electric and magnetic fields between the plates.

3. A process as defined in claim 1, and further comprising the steps of introducing a gas with high ionization probability into the discharge chamber of the printing head with a pumping device, and drawing air out of the discharge chamber with a pumping device prior to the step of producing the discharge plasma.

4. A process as defined in claim 3, wherein the gas introducing step includes introducing a noble gas into the discharge chamber.

5. A process as defined in claim 1, wherein the plasma producing step includes producing the discharge plasma in the discharge chamber by direct current.

6. A process as defined in claim 1, wherein the plasma producing step includes producing the discharge plasma in the discharge chamber by alternating current.

7. A process as defined in claim 1, wherein the plasma producing step includes producing the discharge plasma in the discharge chamber by a high-frequency electric field.

8. A process as defined in claim 1, and further comprising the step of evacuating the discharge chamber to a gas pressure at which independent glow discharge occurs.

9. A printing head for imaging a ferroelectric printing form, comprising: a discharge chamber; and an elastically deformable seal connected to the discharge chamber and configured to sealingly contact a surface of the printing form during printing.

10. A printing head for imaging a ferroelectric printing form, comprising: a discharge chamber; an elastically deformable seal connected to the discharge chamber and configured to be sealingly contactable against a surface of the printing form; and pump means for producing a vacuum in the discharge chamber.

11. A printing head as defined in claim 10, wherein the pump means is operative to produce a pressure of less than 10 hPa in the discharge chamber.

12. A printing head as defined in claim 10, wherein the seal is formed of a rubber.

13. A printing head as defined in claim 10, wherein the seal is formed of an elastic plastic material.

14. A printing head as defined in claim 10, wherein the seal includes a plurality of spring-loaded sealing elements.

15. A printing head for imaging a ferroelectric printing form, comprising: a discharge chamber; an elastically deformable seal connected to the discharge chamber and configured to be sealingly contactable against a surface of the printing form; and at least one electrode operative to produce at least one discharge plasma.

16. A printing head as defined in claim 15, and further comprising plates with at least one of openings, passages and holes, the plates being arranged in the discharge chamber so as to focus beams of charge carriers from the electrode which are deflected in a direction of the printing form in order to polarize the printing form in accordance with image points.

17. A printing head as defined in claim 16, wherein the plates are formed at least partially as elongate separated adjacent wafers with holes, the wafers being individually controllable chronologically according to the image points to be produced on the printing form.

18. A printing head for imaging a ferroelectric printing form, comprising: a discharge chamber; an elastically deformable seal connected to the discharge chamber and configured to be sealingly contactable against a surface of the printing form; and a plurality of electrodes operative to produce a plurality of discharge plasmas corresponding to the number of electrodes.

* * * * *